United States Patent [19]

Kusukawa et al.

[11] Patent Number: 5,251,071
[45] Date of Patent: Oct. 5, 1993

[54] COLOR FILTER

[75] Inventors: Hiroyuki Kusukawa; Yasuhide Nakajima, both of Tokyo, Japan

[73] Assignee: Dai Nippon Printing Co., Ltd., Tokyo, Japan

[21] Appl. No.: 779,353

[22] Filed: Oct. 18, 1991

[30] Foreign Application Priority Data

Oct. 19, 1990 [JP] Japan .................................. 2-280753

[51] Int. Cl.$^5$ ................................................. G02B 5/22
[52] U.S. Cl. ..................................... 359/891; 359/885; 359/68; 252/582; 430/7; 358/64
[58] Field of Search ................. 359/885, 886, 891, 68, 359/87, 900; 252/582; 430/7, 321; 358/64

[56] References Cited

U.S. PATENT DOCUMENTS

| | | | |
|---|---|---|---|
| 4,846,556 | 7/1989 | Haneda | 359/891 |
| 4,853,296 | 8/1989 | Fukuyoshi | 359/68 |
| 4,934,791 | 6/1990 | Shimizu et al. | 359/68 |
| 5,045,418 | 9/1991 | Fukuyoshi | 430/7 |

Primary Examiner—Loha Ben
Attorney, Agent, or Firm—Dellett, Smith-Hill and Bedell

[57] ABSTRACT

The color filter according to the present invention contains black matrix formed by polyimide, which contains light shielding pigments such as carbon black, triiron tetraoxide, etc. instead of the black matrix used in the past, which is formed by metal thin film such as chromium on glass substrate. Epoxy type silane coupling agent is mixed with polyimide precursor composition, and this is coated on a glass substrate and then imidized. Thus, the color filter is provided with black matrix having high bonding strength with glass substrate.

2 Claims, 4 Drawing Sheets

COLOR FILTER

BACKGROUND OF THE INVENTION

The present invention relates to a color filter used for color liquid crystal display unit, and in particular to a color filter having special features in black matrix.

In a liquid crystal display unit, at least two transparent substrates made of the material such as glass having transparent electrodes are provided face to face to each other with spacings of 1 to 10 $\mu$ and liquid crystal substance is sealed therebetween and the liquid crystals are oriented in a certain direction by applying voltage across the electrodes so that transparent and non-transparent portions are formed to display the image. In a color liquid crystal display unit, three-color filters for red (R), green (G) and blue (B) corresponding to three primary colors of light are furnished on one of transparent electrode substrates. By adjusting the voltage applied on the transparent electrode, the transmission of liquid crystal light is controlled. Thus, by controlling the light quantity of the light transmitting 3 color filters for R, G and B, color display is accomplished by developing colors through the addition of 3 primary colors.

The layers colored with the colors of R, G and B of a color filter are formed on a substrate where black matrix is provided for defining the boundary of the colors. Black matrix defines three primary colors of R, G and B of the color layers, and it also shields the light for the electrodes for driving of liquid crystal or transistor such as TFT on the substrate placed face-to-face to the color filter.

The black matrix formed on the color filter is usually formed by thin film of metals such as chromium, nickel, aluminum, etc.

To form the black matrix, thin film of these metals is placed on glass substrate by the methods such as sputtering, vacuum evaporation, etc. Then, photo resist patterns are formed by the technique of photolithography, and the pattern is formed by etching metal thin film using photo resist pattern as the etching mask.

Although black matrix made of metal thin film is formed by the methods such as sputtering, vacuum evaporation, etc., the cost for forming film is expensive. Because metal thin film has metallic luster, the reflected light from metal chromium thin film is increased in case the light entering the display unit from outside is strong, and this results in the deterioration of display quality in a transmission type display unit such as liquid crystal display unit.

For the purpose of decreasing the reflectivity of metal chromium, it is proposed to form chromium thin film after a film of low reflectivity such as chromium oxide is placed on glass substrate before metal chromium thin film is formed. However, this is not very desirable because more processes are required and the manufacturing cost is increased.

Under such circumstances, the present inventor has proposed the following manufacturing method in the Japanese Patent Application which describes a color filter having black matrix made of polyimide type resin with dispersed light shielding material such as carbon black as the black matrix with low reflectivity and low manufacturing cost, and which also discloses a method for manufacturing such color filter.

Description is now given on the manufacturing method of black matrix of polyimide type in connection with FIGS. 2 (A)-2 (F), which show a cross-sectional views of color filter: To a glass substrate 10, which has been washed well by conventional method as shown in FIG. 2 (A), pre-treatment for increasing the bonding strength with polyimide to be formed is performed using a pre-treatment agent 11.

On the glass substrate thus pre-treated, carbon black, metal oxides such as triiron tetraoxide or mixture of these substances are dispersed in polyamic acid solution, and this is coated on the glass substrate 10 by roll coating method or spin coating method to form the coated layer 12 as shown in FIG. 2 (B).

After polyamic acid is coated, pre-baking is performed as shown in FIG. 2 (C). Then, photo resist is coated on the coated layer of polyamic acid compositions to form a photo resist layer 13. The photo resist layer is exposed to light using a predetermined photo mask 14 as shown in FIG. 2 (D) and the image is developed. Thus, the desired pattern is formed on the photo resist layer.

Then, as shown in FIG. 2 (E), the coated layer of polyamic acid is etched according to the pattern of the photo resist layer, and the photo resist layer is detached as given in FIG. 2 (F).

When the photo resist layer on the black matrix 15 is detached through oxidation as in the manufacturing process by photolithography in a semiconductor manufacturing system, black matrix is also damaged as it is an organic substance located in lower layer of the photo resist layer. For this reason, it is practiced to selectively dissolve and detach only the photoresist layer using various types of organic solvents.

In case novolak type photo resist is used, the following various types of organic solvents can be used: Ketone type organic solvents such as acetone, methylethylketone, etc., alcoholic type organic solvents such as methanol, ethanol, etc. cellosolve type organic solvents such as ethyl cellosolve, cellosolve acetate type solvents such as ethyl cellosolve acetate, ester type organic solvents such as butyl acetate, or glycol type organic solvents.

For the treatment to increase the bonding strength between glass substrate and polyimide, aminosilane type coupling agent such as $\gamma$-(2-aminoethyl)-aminopropyltrimethoxysilane, $\gamma$-aminopropyltriethoxysilane, etc. having high affinity with silicon, which is a component of glass, has been used.

To treat the glass substrate by an aminosilane type coupling agent in order to increase bonding strength, it is necessary to use coupling agent for coating process and drying process.

SUMMARY OF THE INVENTION

The object of the present invention is to offer a compound, which can form black matrix having high adhesive strength to glass substrate, and it is characterized in that the adhesive strength of polyimide layer is increased either by coating the substrate with a compound consisting of silane coupling agent having epoxy group mixed with the mixture containing a polyimide precursor composed of polyamic acid, or by coating the mixture containing a polyimide precursor on a layer of epoxy type silane coupling agent formed on the substrate.

DESCRIPTION OF THE PREFERRED EMBODIMENT

It has been proposed in the past to mix the compound such as aminosilane with the polyamic acid instead of coating it on glass substrate in order to increase adhesive strength before polyimide resin layer is formed. When aminosilane is added to polyamic acid compound, it is not possible to form thin film on glass substrate because polyamic acid is turned to gel state when aminosilane is added. The present inventor has been searching a substance, which can increase the adhesive strength with glass substrate without changing the property of polyamic acid and has found that the adhesive strength with glass can be increased without turning polyamic acid to gel state by adding silane compound having epoxy group to polyamic acid. As epoxysilane usable for the purpose of this invention, $\gamma$-glycidoxypropyltrimethoxysilane, $\gamma$-glycidoxypropylmethyldiethoxysilane, $\beta$-(3,4-epoxycyclohexyl)-ethyltrimethoxysilane, etc. can be used.

In the following, description is given on the manufacturing process of the color filter according to the present invention in connection with the drawings.

Figure 1:
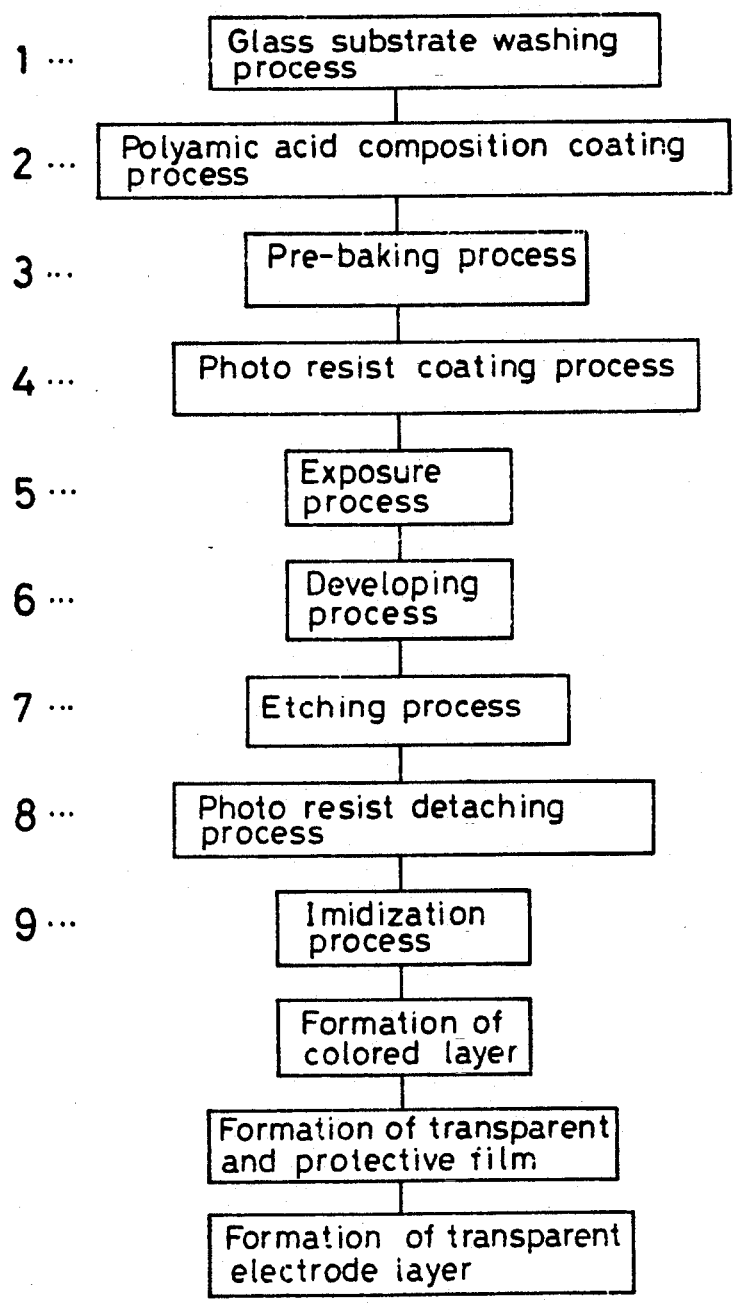
FIG. 1 is a drawing for explaining the manufacturing process of a color filter according to the present invention.
Figure 2A:
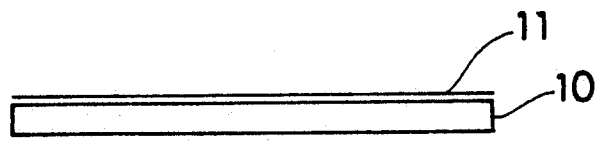
FIGS. 2 (A)–2 (F) are cross-sectional view showing a manufacturing process of a conventional type color filter.
Figure 2B:
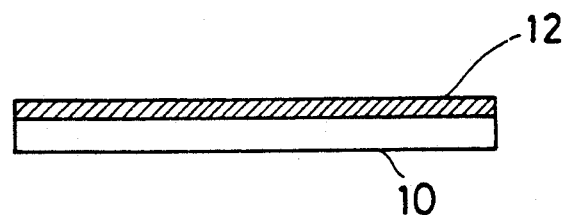
Figure 2C:
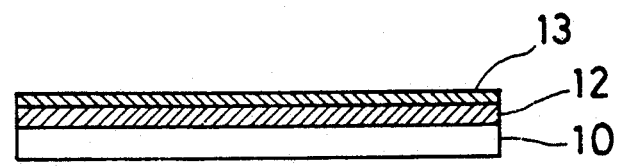
Figure 2D:
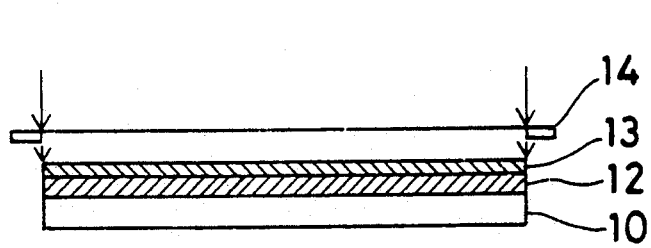
Figure 2E:
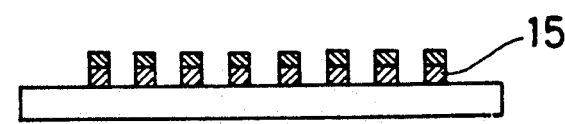
Figure 2F:
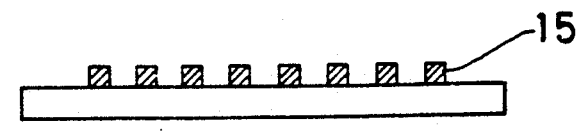

FIG. 1 is a drawing for explaining the manufacturing process of such color filter. As the glass substrate, the substrate made from Corning 7059 or borosilicate glass with lower thermal expansion coefficient or soda lime glass are used, and organic substances attached on glass substrate surface are removed by organic solvent, acid, alkali, water, etc. in the washing process 1 of glass substrate.

In the polyamic acid coating process 2, the glass substrate is coated with the solution, in which light shielding material for preventing the transmission of light is dispersed in the solution of polyamic acid, easily imidized by heating, by means of roll coating method or spin coating method.

As the polyamic acid solution, commercial polyimide precursor such as PIQ/PIX series (Hitachi Chemical Co., Ltd.), Semico Fine SP series (Toray Industries, Inc.), Pymel series (Asahi Chemical Industries Co., ltd.), Pyralin series (DuPont), etc. are used.

As the light shielding material, pigments such as carbon black, triiron tetraoxide, etc. are dispersed.

The light shielding material is dispersed by stirring the solution, or by ball mill method, or 3-roll method. If small quantity of surface active agent is added, the dispersion of light shielding material can be stabilized.

It is preferable that the particle used as light shielding material is 1 $\mu$ or less in size to attain the stability of the dispersed particles.

Further, silane coupling agent having epoxy group is mixed to the solution of polyamic acid.

Silane coupling agent with epoxy group is added by 0.005% to 0.5% in weight to polyamic acid solution.

If the quantity of silane coupling agent with epoxy group is less than 0.005%, the adhesive strength of black matrix is improved less. On the other hand, if it is mixed by 0.5% or more, no change is seen in the mixed compound, but the film of polyamic acid cannot be removed completely even if it is attempted to remove it by etching through the mask of the photo resist pattern is formed on the coated polyamic acid film. Thus, it should be mixed by 0.5% or more.

Although the film thickness of polyamic acid composition thus formed varies according to the optical shielding property of polyamic acid, in which shielding material is dispersed, the film with thickness of 0.5 to 2.0 $\mu$ is formed. And after polyamic acid solution with dispersed shielding material is coated, pre-baking treatment is performed in the pre-baking process 3 by heating at 130° C. to 150° C. for 30 minutes.

To etch the film coated with polyamic acid composition, a predetermined pattern is formed on the film coated with polyamic acid. To obtain the pattern with high dimensional accuracy, photo resist is coated on the polyamic acid coated film in the photo resist coating process 4, and after pre-baking it on a heat plate or in an oven heated at 90° C. to 100° C., the pattern is formed by the technique of photolithography.

The photo resist of both positive and negative types can be used. Especially, it is preferable to use novolak type photo resist, which is widely used as positive type photo resists because, after exposure to light using photomask, alkali solution such as sodium hydroxide, tetramethyl ammonium, etc. can be used for development. As the result, the exposed portion of photo resist is removed by alkali solution and polyamic acid is also removed at the same time. Thus, it is possible to perform photo resist development and etching of the polyamic acid coated layer at the same time, and the process can be shortened.

The photo resist with the predetermined pattern is exposed to light in the exposure process 5 using ultra-high voltage mercury lamp as light source, and the pattern is then developed in the developing process 6.

In case of a positive type photo resist such as novolak type, alkali solution is used for development as described above. Because the removal of the exposed portion of photo resist and the etching of polyamic acid composition can be performed at the same time, the etching process 7 can be shortened.

Next, in the photo resist detaching process 8, photo resist is detached, which remains on the film coated with polyamic acid composition, formed in the predetermined pattern on glass substrate.

To detach the photo resist, only the photo resist is dissolved by various types of organic solvents and is removed because the film coated with polyamic acid composition with pattern may be damaged by the detachment through oxidation, which is used in the manufacturing process of semiconductor integrated circuits.

In case novolak type resist is used, photo resist can be easily detached by the following organic solvents: ketone type organic solvents such as acetone, methylethylketone, etc. alcohol type solvents such as methanol, ethanol, etc., cellosolve type solvent such as ethyl cellosolve, or ester type solvents such as butyl acetate, or glycol type organic solvents.

Above all, it is preferable to use glycol ethers such as ethyleneglycol monobutyl ether, diethyleneglycol diethyl ether, diethyleneglycol monoether acetate, dipropyleneglycol monomethyl ether, etc. because these have ignition point of 70° C. or upper and are compatible with water, are easier to handle and water can be used also for the washing process of residue after the detachment process. Thus, the process can be simplified. Some organic solvents may cause damage such as cracking or dissolving to the polyamic acid coated film thus pre-baked but the detachment solution using glycol ether does not cause such damage. The composition containing polyamic acid after detaching photo resist is turned to polyimide in the imidization process 9 by heating polyamic acid to 250° C. or more.

On the substrate of color filter where black matrix is formed, a colored layer is provided by photolithography or printing method. Transparent protective film is formed on the colored layer, and transparent electrode layer with the predetermined pattern is formed on the transparent protective film. Thus, a color filter is manufactured.

As described above, if polyimide precursor composition mixed with epoxy type silane coupling agent is used, black matrix with high bonding strength can be obtained without the pre-treatment process for glass substrate, i.e. without coating process and drying process for silane coupling agent.

Also, it is possible to obtain black matrix with high bonding strength by the following procedure: Epoxy type silane coupling agent is coated on glass substrate to form a layer. After coating polyimide precursor composition on it, the pattern is formed, and polyimide precursor is imidized.

The composition containing polyamic acid after detaching photo resist is turned to polyimide in the imidization process 9 by heating polyamic acid at 250° C. or more.

EXAMPLE 1

A glass substrate (Corning 7059) with thickness of 1.1 mm is used as substrate after thoroughly washing.

As polyimide precursor, 14% solution of Pyralin PI-2545 (DuPont) commercially available is used as polyamic acid. To one part of polyamic acid (converted to 100%), one part of carbon black is added. After mixing it in a sand mill to disperse carbon black, $\gamma$-butyl lactone is added to the dispersion solution thus obtained to adjust viscosity. Then, $\gamma$-glyoidoxypropyltrimethoxysilane (Toray Silicone Co., Ltd.; SH6020) is added by 0.001 to 3 wt % to prepare the solution.

This solution was coated on glass substrate in thickness of 1.5 $\mu$ by spin coating and was pre-baked by heating to 130° C. on a hot plate to remove organic solvent.

On the polyamic acid coated film, OFPR-800 (Tokyo Ohka Industry Co., Ltd.) was coated as positive type resist, and it was pre-baked on a hot plate heated to 90° C.

The coated film formed on the substrate 1 was exposed to light irradiated from 2.0 kW ultra-high voltage mercury lamp for 10 seconds through a photo mask. Then, the exposed portion of photo resist was removed, using NMD-3 (Tokyo Ohka Industry Co., Ltd.) as developing solution, and polyamic acid etching was performed at the same time.

The color filter was immersed for 45 seconds in diethyleneglycol monobutyl ether. After the photo resist on the polyamic acid coated film was detached, it was washed with water. When the black matrix examined under microscope ($\times$400), no defect was found such as cracking, narrowed line width, etc.

Then, it was placed in an oven kept at 250° C., and polyamic acid was turned to polyimide.

Figure 3:
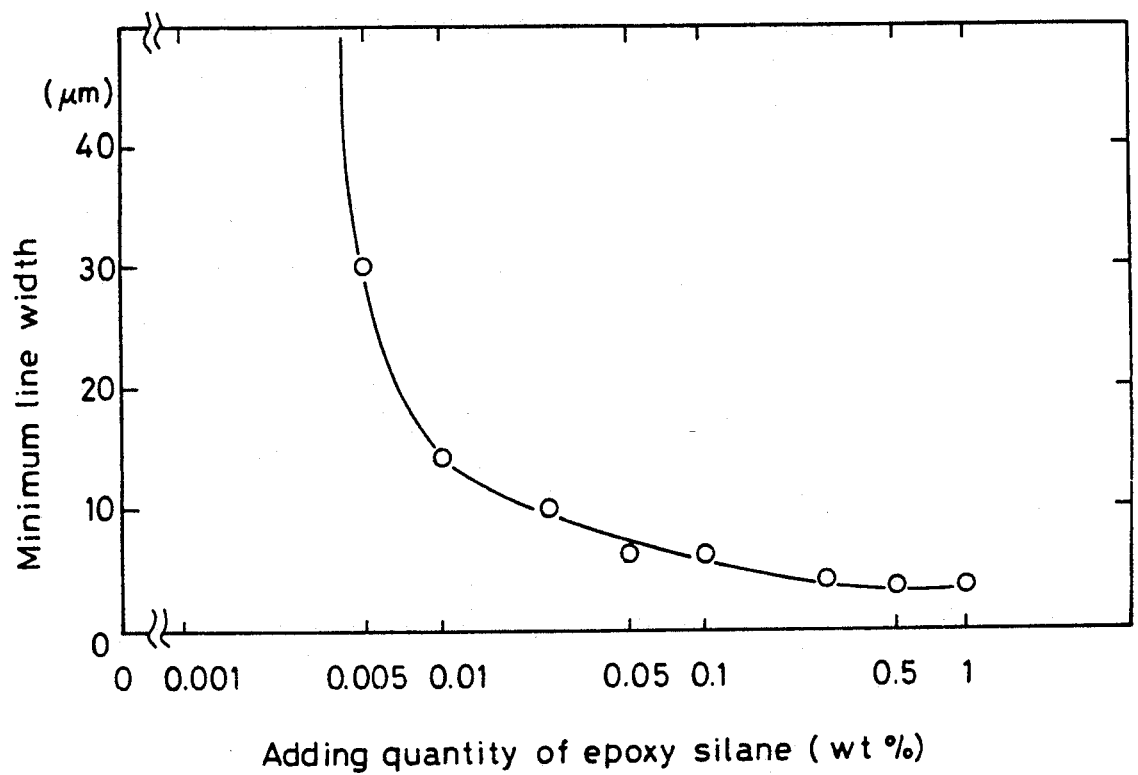
FIG. 3 is a diagram showing the relationship between the pattern line width to be formed and the adding quantity of epoxysilane.

In this case, it was found that the minimum line width of the pattern of formable polyimide depends upon the adding quantity of epoxy silane added to polyamic acid as shown in FIG. 3. Namely, if the adding quantity of epoxy silane is too low, sufficient bonding strength is not obtained between polyamic acid and glass substrate, and fine pattern is separated from the glass substrate during polyamic acid etching or during rinsing. Therefore, to form the pattern of 10 $\mu$ or less, which is required as black matrix layer for color filter for liquid crystal display unit, it is necessary to add epoxy silane by 0.05 wt % or more.

Figure 4:
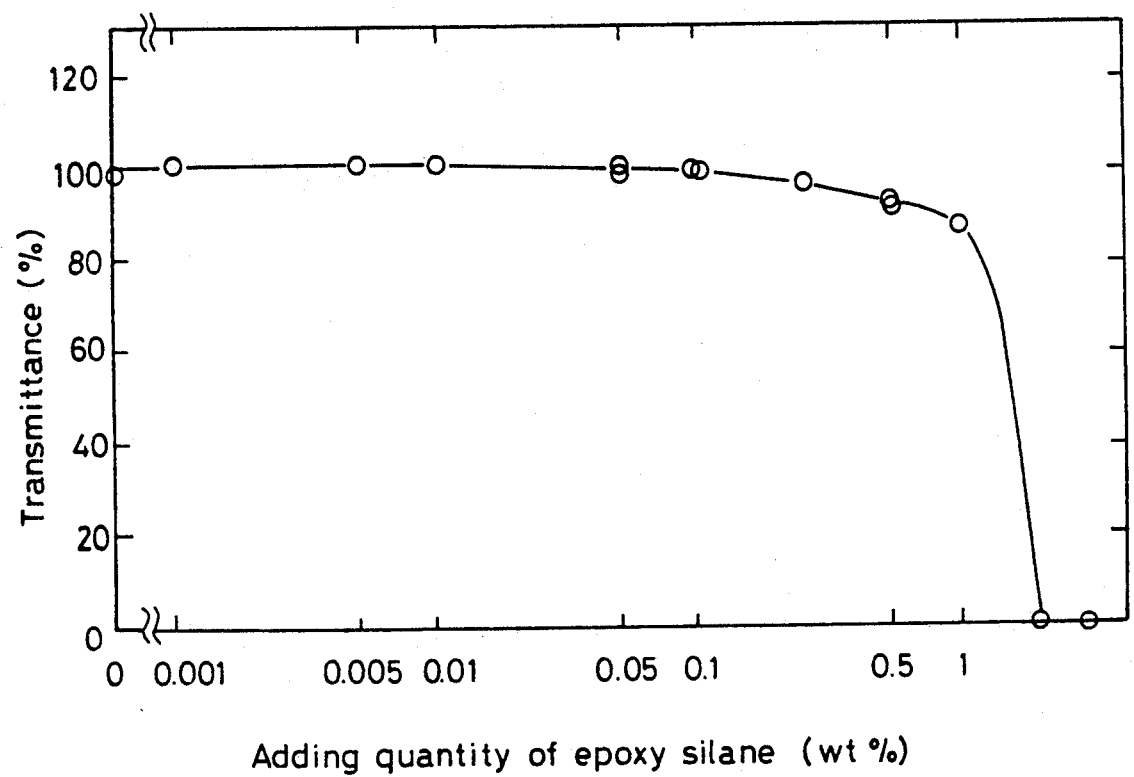
FIG. 4 is a diagram showing the relationship between the adding quantity of epoxysilane and light transmittance of the transparent portion where black matrix is not formed.

On the other hand, FIG. 4 summarizes the results of the measurement by the light of 450 nm, showing the relationship between the adding quantity of epoxy silane and the light transmittance of the transparent portion, where black matrix removed by etching is not formed. The polyamic acid composition containing epoxy silane by 0.2 wt % or more is difficult to etch, and sufficient transmission is not obtained because black matrix thin film containing light shielding material remains on the portion, which is originally to be removed.

From these results, it is desirable that epoxy silane is added by 0.05 wt % to 0.1 wt %.

On the substrate where black matrix is formed, red, green and blue pigments are dispersed on photosensitive resin by the composition ratio as shown in Table 1 to prepare colored photosensitive resins in red, green and blue. The red photosensitive resin was coated in thickness of 1.2 $\mu$. Then, it was dried in an oven kept at 70° C. for 30 minutes, and it was exposed to light using a mercury lamp. Spray development with water was performed for 1 minute, and red relief image was formed in an area where red pixel should be formed. Further, it was heated and hardened at 150° C. for 30 minutes.

By repeating the same process, green relief image was formed on an area where green pixel should be formed, and blue relief image was formed in an area where blue pixel should be formed. Thus, colored layers were prepared.

TABLE 1

| (Unit: wt %) | |
|---|---|
| (1) Red photosentive resin | |
| Shimura first pyrazolone red BT (Dainippon Ink Chemical Industry Co., Ltd.; red pigment) | 10 |
| Polyvinyl alcohol/5% stilbazorium Quinolium (photosentive resin) | 5 |
| Water | 85 |
| (2) Green photosensitive resin | |
| Lionol green 2Y-301 (Toyo Ink Manufacturing Co., Ltdl; green pigment) | 9 |
| Polyvinyl alcohol/5% stilbazorium Quinolium (photosensitive resin) | 5 |
| Water | 86 |
| (3) Blue photosensitive resin | |
| First Genblue - GNPS (Dainippon Ink Chemical Industry Co., Ltd.; blue pigment) | 3 |
| Polyvinyl alcohol/5% stilbazorium Quinolium (photosensitive resin) | 5 |
| Water | 82 |

Then, light curing mixture was prepared by mixing 35 weight parts of o-cresol-novolak epoxy acrylate (molecular weight 1500-2000) as light curing acrylate oligomer and 15 weight parts of cresol novolak type epoxy resin, and by mixing 50 weight parts of dipentaerythritol hexacrylate (Nippon Kayaku Co., Ltd.; DPHA) as multifunctional polymeric monomer. Further, 2 weight parts of Ilgacure (Ciba Geigy) was added as polymerization initiator, and 2 weight parts of UVE1014 (General Electric) was added as epoxy curing agent. This mixture is dissolved in 200 weight parts of ethyl cellosolve acetate. 10 g of this solution was coated on the above colored layer in thickness of 2.0 $\mu$ using spin coater. A photo mask was placed at a distance of 100 $\mu$ from the coated film, and ultraviolet ray was irradiated for 10 seconds only on the colored layer by 2.0 kW ultra-high voltage mercury lamp using proximity aligner. Then, it was immersed in a developing solution containing 1,1,2,2-tetrachloro-ethane kept at 25° C. for one minute, and non-cured portion of the coated film was removed.

Next, on the protective film thus formed, ITO film (composite film of indium oxide and tin oxide) was coated in thickness of 0.4 $\mu$ by the sputtering method.

COMPARATIVE EXAMPLE 1

A color filter was manufactured by the same procedure as in the Example 1, except that the photo resist on the coated film of polyamic acid was detached by immersing in diethyleneglycol for 90 seconds. When the black matrix was examined under microscope ($\times 400$), cracking was seen at the crossings of grids.

What we claim is:

1. A color filter provided with a colored layer comprising resin and a black matrix to define the colored layer formed on a transparent matrix, characterized in that the black matrix is obtained by imidizing a plyimide precursor composition mixed with a silane coupling agent of epoxy type.

2. A color filter according to claim 1, wherein the epoxy type silane coupling agent is selected from
$\gamma$-glycidoxypropyltrimethoxysilane,
$\gamma$-glycidoxylpropylmethyldiethoxysilane, and
$\beta$-(3,4-epoxycyclohexyl)-ethyltrimethoxysilane.

* * * * *